(12) United States Patent
Plants

(10) Patent No.: US 7,099,189 B1
(45) Date of Patent: Aug. 29, 2006

(54) SRAM CELL CONTROLLED BY NON-VOLATILE MEMORY CELL

(75) Inventor: William C. Plants, Campbell, CA (US)

(73) Assignee: Actel Corporation, Mountain View, CA (US)

(*) Notice: Subject to any disclaimer, the term of this patent is extended or adjusted under 35 U.S.C. 154(b) by 25 days.

(21) Appl. No.: 10/959,404

(22) Filed: Oct. 5, 2004

(51) Int. Cl.
G11C 14/00 (2006.01)
(52) U.S. Cl. ............ 365/185.08; 365/154; 365/189.12
(58) Field of Classification Search .......... 365/185.08, 365/154, 189.12
See application file for complete search history.

(56) References Cited

U.S. PATENT DOCUMENTS

| | | | |
|---|---|---|---|
| 4,503,494 A | 3/1985 | Hamilton et al. ............ 364/200 |
| 4,630,238 A * | 12/1986 | Arakawa ................ 365/185.08 |
| 4,855,954 A | 8/1989 | Turner et al. ................ 365/185 |
| 4,879,688 A | 11/1989 | Turner et al. ................ 365/201 |
| 5,101,122 A | 3/1992 | Shinonara .................... 307/465 |
| 5,189,641 A * | 2/1993 | Arakawa ................ 365/185.08 |
| 5,237,218 A | 8/1993 | Josephson et al. .......... 307/465 |
| 5,237,699 A | 8/1993 | Little et al. .................. 395/750 |
| 5,272,368 A | 12/1993 | Turner et al. ................ 257/315 |
| 5,329,487 A | 7/1994 | Gupta et al. ................. 365/185 |
| 5,336,951 A | 8/1994 | Josephson et al. .......... 307/465 |
| 5,451,912 A | 9/1995 | Torode .................... 331/108 C |
| 5,491,666 A * | 2/1996 | Sturges ........................ 365/154 |
| 5,548,228 A | 8/1996 | Madurawe .................... 326/41 |
| 5,559,449 A | 9/1996 | Padoan et al. ................. 326/40 |
| 5,564,526 A | 10/1996 | Hastings et al. .............. 326/37 |
| 5,581,501 A | 12/1996 | Sansbury et al. ....... 365/185.01 |
| 5,587,603 A | 12/1996 | Kowshik ..................... 257/316 |
| 5,684,434 A | 11/1997 | Mann et al. .................... 331/16 |
| 5,696,455 A | 12/1997 | Madurawe .................... 326/41 |
| 5,729,495 A | 3/1998 | Madurawe ............. 365/185.25 |
| 5,740,110 A | 4/1998 | Madurawe ............. 365/185.25 |
| 5,805,516 A | 9/1998 | Madurawe .................. 365/204 |
| 5,811,987 A | 9/1998 | Ashmore, Jr. et al. ........ 326/39 |
| 5,812,450 A | 9/1998 | Sansbury et al. ....... 365/185.08 |
| 5,847,993 A | 12/1998 | Dejenfelt ................. 365/185.1 |
| 5,877,656 A | 3/1999 | Mann et al. .................... 331/16 |
| 5,889,701 A | 3/1999 | Kang et al. ............ 365/185.18 |
| 5,914,904 A | 6/1999 | Sansbury .................... 365/218 |
| 5,949,250 A | 9/1999 | Schmidt et al. ............... 326/38 |
| 5,949,710 A | 9/1999 | Pass et al. ............. 365/185.05 |

(Continued)

OTHER PUBLICATIONS

"Non-volatile SRAM (General Introduction)—nvSRAM—SRAM and EEPROM within a single chip", ZMD®, pp. 1/4-4/4, Oct. 2001.

Primary Examiner—Huan Hoang
(74) Attorney, Agent, or Firm—Sierra Patent Group, Ltd

(57) ABSTRACT

First and second complimentary static random-access-memory cell bit lines are coupled to first and second bit nodes through first and second access transistors controlled by a word line. A first inverter has an input coupled to the first bit node and an output coupled to the second bit node. A second inverter has an input coupled to the second bit node and an output coupled to the first bit node through a first transistor switch. A transistor switch is coupled between the output of a non-volatile memory cell and the first bit node. A control circuit coupled to the gate of the transistor switch. Either the drive level of the non-volatile memory cell is selected to overpower the output of the second inverter or the second inverter is decoupled from the first bit node while the output of the non-volatile memory cell is coupled to the first bit node.

8 Claims, 2 Drawing Sheets

U.S. PATENT DOCUMENTS

| | | | |
|---|---|---|---|
| 5,949,987 A | 9/1999 | Curd et al. | 395/500.17 |
| 5,999,014 A | 12/1999 | Jacobson et al. | 326/38 |
| 6,005,806 A | 12/1999 | Madurawe et al. | 365/185.23 |
| 6,018,476 A | 1/2000 | Madurawe et al. | 365/185.23 |
| 6,028,787 A | 2/2000 | Sansbury et al. | 365/185.01 |
| 6,031,763 A | 2/2000 | Sansbury | 365/185.24 |
| 6,034,541 A | 3/2000 | Kopec, Jr. et al. | 326/39 |
| 6,052,308 A * | 4/2000 | Pitts | 365/185.21 |
| 6,052,309 A | 4/2000 | Madurawe et al. | 365/185.28 |
| 6,078,521 A | 6/2000 | Madurawe et al. | 365/185.18 |
| 6,091,641 A | 7/2000 | Zink | 365/185.28 |
| 6,104,257 A | 8/2000 | Mann | 331/158 |
| 6,134,707 A | 10/2000 | Herrmann et al. | 717/5 |
| 6,144,580 A | 11/2000 | Murray | 365/185.01 |
| 6,145,020 A | 11/2000 | Barnett | 710/8 |
| 6,191,660 B1 | 2/2001 | Mar et al. | 331/111 |
| 6,226,201 B1 | 5/2001 | Madurawe et al. | 365/185.28 |
| 6,236,597 B1 | 5/2001 | Sansbury | 365/185.28 |
| 6,243,296 B1 | 6/2001 | Sansbury | 365/185.18 |
| 6,243,842 B1 | 6/2001 | Slezak et al. | 714/724 |
| 6,272,646 B1 | 8/2001 | Rangasayee et al. | 713/500 |
| 6,295,230 B1 | 9/2001 | Madurawe et al. | 365/185.28 |
| 6,304,099 B1 | 10/2001 | Tang et al. | 326/38 |
| 6,334,208 B1 | 12/2001 | Erickson | 716/17 |
| 6,346,905 B1 | 2/2002 | Ottini et al. | 341/159 |
| 6,356,107 B1 | 3/2002 | Tang et al. | 326/40 |
| 6,356,478 B1 | 3/2002 | McCollum | 365/185.01 |
| 6,366,498 B1 | 4/2002 | Madurawe et al. | 365/185.28 |
| 6,389,321 B1 | 5/2002 | Tang et al. | 700/2 |
| 6,396,168 B1 | 5/2002 | Ghezzi et al. | 307/44 |
| 6,408,432 B1 | 6/2002 | Herrmann et al. | 717/139 |
| 6,414,368 B1 | 7/2002 | May et al. | 257/523 |
| 6,415,344 B1 | 7/2002 | Jones et al. | 710/105 |
| 6,433,645 B1 | 8/2002 | Mann et al. | 331/18 |
| 6,442,068 B1 | 8/2002 | Bartoli et al. | 365/185.12 |
| 6,483,344 B1 | 11/2002 | Gupta | 326/41 |
| 6,490,714 B1 | 12/2002 | Kurniawan et al. | 716/17 |
| 6,515,551 B1 | 2/2003 | Mar et al. | 331/111 |
| 6,526,557 B1 | 2/2003 | Young et al. | 716/16 |
| 6,532,170 B1 | 3/2003 | Madurawe et al. | 365/185.1 |
| 6,552,935 B1 | 4/2003 | Fasoli | 365/185.33 |
| 6,594,192 B1 | 7/2003 | McClure | 365/225.7 |
| 6,600,355 B1 | 7/2003 | Nguyen | 327/298 |
| 6,614,320 B1 | 9/2003 | Sullam et al. | 331/46 |
| 6,651,199 B1 | 11/2003 | Shokouhi | 714/727 |
| 6,674,332 B1 | 1/2004 | Wunner et al. | 331/18 |
| 6,748,577 B1 | 6/2004 | Bal | 716/16 |
| 6,753,739 B1 | 6/2004 | Mar et al. | 331/176 |
| 6,847,543 B1 * | 1/2005 | Toyoda et al. | 365/154 |
| 2001/0030554 A1 | 10/2001 | Ghezzi et al. | 326/39 |
| 2002/0007467 A1 | 1/2002 | Ma et al. | 713/501 |
| 2002/0108006 A1 | 8/2002 | Snyder | 710/100 |
| 2003/0001614 A1 | 1/2003 | Singh et al. | 326/40 |
| 2003/0005402 A1 | 1/2003 | Bal | 716/16 |
| 2003/0074637 A1 | 4/2003 | Pavesi et al. | 716/1 |
| 2003/0197218 A1 | 10/2003 | Pass et al. | 257/315 |
| 2003/0210585 A1 | 11/2003 | Bernardi et al. | 365/200 |
| 2003/0210599 A1 | 11/2003 | McClure | 365/225.7 |
| 2003/0214321 A1 | 11/2003 | Swami et al. | 326/38 |
| 2004/0008055 A1 | 1/2004 | Khanna et al. | 326/40 |
| 2004/0036500 A1 | 2/2004 | Bratt | 326/39 |

* cited by examiner

SRAM CELL CONTROLLED BY NON-VOLATILE MEMORY CELL

BACKGROUND

Field of the Invention

The present invention relates to programmable integrated circuit devices that include static random access memory. More particularly, the present invention relates to controlling a static random-access memory cell from the output of a non-volatile memory cell such as a flash memory cell.

Traditional static-random-access memory (SRAM) cells used as the programmable elements of a programmable logic device such as a field-programmable gate array (FPGA) are shown below in FIG. 1. These cells each employ a pair of head-to-tail connected inverters 10 and 12 connected between complementary data bit nodes 14 and 16.

These SRAM cells can be employed as programming elements of the programmable logic device by activating configuration wordline (CFGWL) 18 to drive configuration bit lines 20 and 22 by turning on transistors 24 and 26. One or both of these configuration bit lines 20 and 22 are used to control the circuit node to be "programmed." The SRAM cell can be written to or read from by activating distributed SRAM word line (DSWL) 28, turning on transistors 30 and 32 to drive complementary data from the data bit nodes 14 and 16 to SRAM bit lines 34 and 36 or use data from SRAM bit lines 34 and 36 to force the states of data bit nodes 14 and 16 and of inverters 10 and 12.

The SRAM cell may also have its state set by clocking in data using MOS transistors 38, 40, 42, 44, and 46 and inverter 48 as a serial shift register as shown. Data is entered onto data node 14 through transistor 38 and is clocked by the two complementary SHCLK clock signals as shown in FIG. 1 to implement a master-slave flip-flop. The complement of the data is generated at transistor 40 and entered onto data node 16 through transistor 42. Transistors 44 and 46 and inverter 48 pass the data to the next SRAM cell in the shift register chain.

SRAM cells shown in FIG. 1 are similar to the types of SRAM cells used, for example, in the Virtex series of FPGAs, available from Xilinx, Inc. These types of cells are loaded from an off-chip non-volatile memory such as a standard flash memory chip.

FPGA devices available from Lattice Semiconductor Corporation and Altera Corporation use on-chip blocks of flash memory to load and control SRAM programmable elements in single chips of the type shown in FIG. 2. This adds an advantage of not needing a separate non-volatile memory chip, but the SRAM configuration still has to be loaded from the non-volatile memory block during power-up.

As shown in FIG. 2, the ispXP (eXpanded Programmability) technology available from Lattice Semiconductor combines the features of electrically-erasable-programmable-read-only memory (EEPROM) and SRAM technologies. A non-volatile EEPROM array 50 distributed within an ispXP device stores the device configuration. At power-up this information is transferred in a massively parallel fashion into SRAM cells shown as small squares in FIG. 2 within dashed-line rectangle 52 that control the operation of the device under the control of control logic 54. Configuration data may be entered through JTAG port 56 or sysCONFIG port 58.

Numerous examples of non-volatile memory cells employable in programmable logic devices are known in the art. See, for example, the ProASIC line of field programmable gate arrays available from Actel Corporation and U.S. Pat. Nos. 5,587,603; 5,847,993; 6,144,580; and 6,356,478.

BRIEF DESCRIPTION OF THE INVENTION

According to one aspect of the present invention, a static random-access memory cell may be controlled by the output of a non-volatile memory cell. The non-volatile memory bit is located substantially adjacent to the SRAM bit. A circuit selectively couples the non-volatile memory cell to the SRAM memory cell so that the SRAM memory cell may be controlled by the output of the non-volatile memory cell.

According to another aspect of the present invention, a static random-access memory cell may be controlled by the output of a non-volatile memory cell such as a flash memory cell.

First and second complimentary static random-access-memory cell bit lines are coupled to first and second bit nodes through first and second access transistors controlled by a word line. A first inverter has an input coupled to the first bit node and an output coupled to the second bit node. A second inverter has an input coupled to the second bit node and an output coupled to the first bit node through a first transistor switch. A transistor switch is coupled between the output of a non-volatile memory cell and the first bit node. A control circuit is coupled to the gate of the transistor switch. Either the drive level of the non-volatile memory cell is selected to overpower the output of the second inverter or the second inverter is decoupled from the first bit node while the output of the non-volatile memory cell is coupled to the first bit node.

Another embodiment of the present invention improves on the operability of the circuit of FIG. 1 by adding the function of non-volatile memory control to the SRAM cell. A static random-access-memory cell has a bit node. A static random-access-memory cell bit line is coupled to the static random-access-memory cell bit node through a first access transistor having a gate coupled to a static random-access-memory cell word line. A configuration bit line is coupled to the static random-access-memory cell bit node through a second access transistor having a gate coupled to a configuration word line. A serial shift register stage has a clock line and coupled to the static random-access-memory cell bit node. A non-volatile memory cell has an output. A transistor switch is coupled between the output of the non-volatile memory cell and the static random-access-memory cell bit node. A control circuit is coupled to the gate of the transistor switch.

In an illustrative embodiment, first and second complimentary static random-access-memory cell bit lines are coupled to first and second bit nodes through first and second access transistors controlled by a SRAM word line. First and second complimentary configuration bit lines are coupled to first and second bit nodes through third and fourth access transistors controlled by a configuration word line. A first inverter has an input coupled to the first bit node and an output coupled to the second bit node. A second inverter has an input coupled to the second bit node and an output coupled to the first bit node. A serial shift register stage is coupled to the first and second bit nodes. The contents of a non-volatile memory bit and its complement are coupled to the first and second bit nodes through fifth and sixth access transistors controlled by a non-volatile memory clock line.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

The present invention uses the advantages of SRAM (distributed SRAM in lookup tables (LUTs), reprogrammable) and combines it with the advantages of non-volatile memory (live on powerup, reprogrammable in background) such as floating-gate (e.g., flash) technology, nanocrystal, SONOS, MONOS, solid-electrolyte switching devices, etc., to provide the programmable element for a programmable logic device such as an FPGA. The present invention also allows the introduction of non-volatility into known SRAM architectures, with minimal disruption to existing designs and products.

The present invention provides a non-volatile memory-controlled SRAM programmable element for an FPGA where a non-volatile programmable element is directly connected to, and proximately located to the SRAM programmable element. In contrast to the prior art, the non-volatile programmable elements are distributed throughout the configurable logic blocks of the FPGA rather than grouped together in a separate array.

According to one aspect of the present invention, a static random-access memory cell may be controlled by the output of a non-volatile memory cell such as a flash memory cell.

First and second complimentary static random-access-memory cell bit lines are coupled to first and second bit nodes through first and second access transistors controlled by a word line. A first inverter has an input coupled to the first bit node and an output coupled to the second bit node. A second inverter has an input coupled to the second bit node and an output coupled to the first bit node through a first transistor switch. A transistor switch is coupled between the output of a non-volatile memory cell and the first bit node. A control circuit is coupled to the gate of the transistor switch. Either the drive level of the non-volatile memory cell is selected to overpower the output of the second inverter or the second inverter is decoupled from the first bit node while the output of the non-volatile memory cell is coupled to the first bit node.

Figure 1:
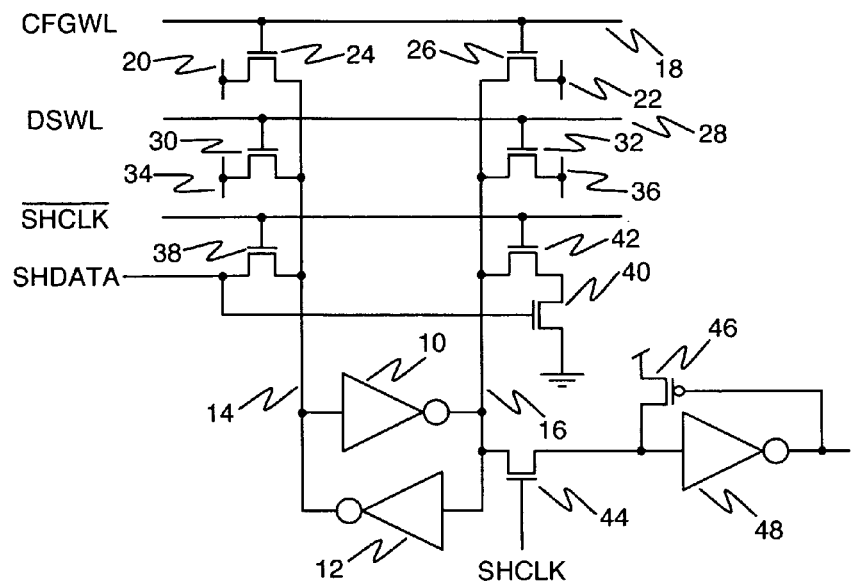
FIG. 1 is a circuit diagram showing a prior-art arrangement wherein SRAM cells are used as the programmable elements of an FPGA.

Another embodiment of the present invention improves on the operability of the circuit of FIG. 1 by adding the function of non-volatile memory control to the SRAM cell. A static random-access-memory cell has a bit node. A static random-access-memory cell bit line is coupled to the static random-access-memory cell bit node through a first access transistor having a gate coupled to a static random-access-memory cell word line. A configuration bit line is coupled to the static random-access-memory cell bit node through a second access transistor having a gate coupled to a configuration word line. A serial shift register stage has a clock line and coupled to the static random-access-memory cell bit node. A non-volatile memory cell has an output. A transistor switch is coupled between the output of the non-volatile memory cell and the static random-access-memory cell bit node. A control circuit is coupled to the gate of the transistor switch.

In an illustrative embodiment, first and second complimentary static random-access-memory cell bit lines are coupled to first and second bit nodes through first and second access transistors controlled by a SRAM word line. First and second complimentary configuration bit lines are coupled to first and second bit nodes through third and fourth access transistors controlled by a configuration word line. A first inverter has an input coupled to the first bit node and an output coupled to the second bit node. A second inverter has an input coupled to the second bit node and an output coupled to the first bit node. A serial shift register stage is coupled to the first and second bit nodes. The contents of a non-volatile memory bit and its complement are coupled to the first and second bit nodes through fifth and sixth access transistors controlled by a non-volatile memory clock line.

Figure 3:
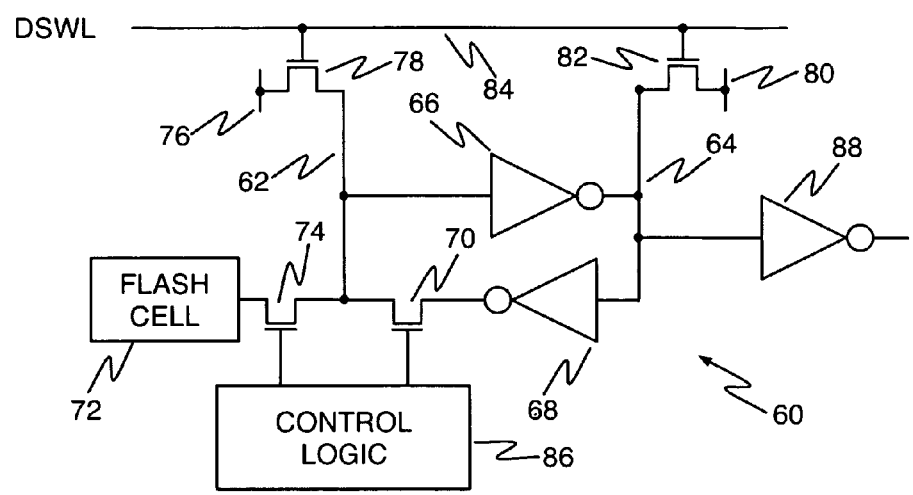
FIG. 3 is a schematic diagram of a circuit including a static random-access memory cell controlled by a non-volatile memory cell according to one aspect of the present invention.

Referring now to FIG. 3, a schematic diagram shows a circuit including a static random-access memory cell controlled by a non-volatile memory cell according to one aspect of the present invention. The SRAM cell 60 of the present invention includes complementary bit nodes 62 and 64. A first inverter 66 has its input coupled to the first bit node 62 and its output coupled to the second bit node 64. A second inverter 68 has its input coupled to the second bit node 64 and its output coupled to the first bit node 62 through n-channel MOS control transistor 70. Non-volatile memory cell 72 has its output coupled to first bit node 62 through n-channel MOS control transistor 74. First bit node 62 is coupled to first bit line 76 through n-channel MOS access transistor 78 and second bit node 64 is coupled to second bit line 80 through n-channel MOS access transistor 82. The gates of n-channel MOS access transistors 78 and 82 are coupled together to SRAM word line 84. The gates of n-channel MOS control transistors 70 and 74 are coupled to control logic 86. Inverter 88 may be used to drive a node at its output that may be controlled by SRAM cell 60 in the manner known for programming an FPGA or other programmable logic device. While FIG. 3 shows inverter 88 coupled to second bit node 64, persons of ordinary skill in the art will appreciate that it could instead be coupled to first bit node 62.

It may be seen that SRAM cell 60 may be written to or read from in the conventional manner by activating SRAM word line 84. Persons of ordinary skill in the art are familiar with pre-charging first and second bit lines 76 and 80 for read operations and driving complementary signals onto first and second bit lines 76 and 80 for write operations.

Control logic 86 is used to write the contents of non-volatile memory cell 72 into SRAM cell 60. During normal operation of SRAM cell 60, n-channel MOS control transistor 70 is turned on and n-channel MOS control transistor 74 is turned off. When a write operation to update the SRAM cell is desired, control logic 86 turns off n-channel MOS control transistor 70 to isolate first bit node 62 from the output of second inverter 68 to prevent the output of second inverter 68 from potentially "fighting" the output of non-volatile memory cell 72. N-channel MOS control transistor 74 is then turned on, driving first bit node 62 to the logic level stored in non-volatile memory cell 72. First inverter 66 inverts this logic state and second inverter 68 inverts the output of first inverter 66. At this point n-channel MOS control transistor 70 can be turned back on and n-channel MOS control transistor 74 can be turned off. The SRAM cell 60 will be in a stable state with the logic level from non-volatile memory cell 72 on the first bit node 62. From the foregoing discussion, it is seen that the design of control logic 76 is simple and straightforward for a person of ordinary skill in the art.

Persons of ordinary skill in the art will observe that n-channel MOS control transistor 70 can be omitted if the output of non-volatile memory cell 72 is buffered by a device stronger than second inverter 68. In this case, the output of inverter 68 is connected directly to bit node 62 and control logic 86 becomes even simpler since it is required only to present a "update" pulse to the gate of n-channel control transistor 74.

With the circuit shown in FIG. 3, the loading of the configuration on power-up does not take as long as with either off-chip flash memory or on-chip block non-volatile memory because the non-volatile programmable element is directly connected to the SRAM programmable element. In theory, the entire FPGA could be reprogrammed in a single load operation, though there are electrical reasons why an orderly series of operations might be used instead (e.g., to prevent current inrush/outrush on Vcc/Gnd due to too many devices turning on at once).

Figure 4:
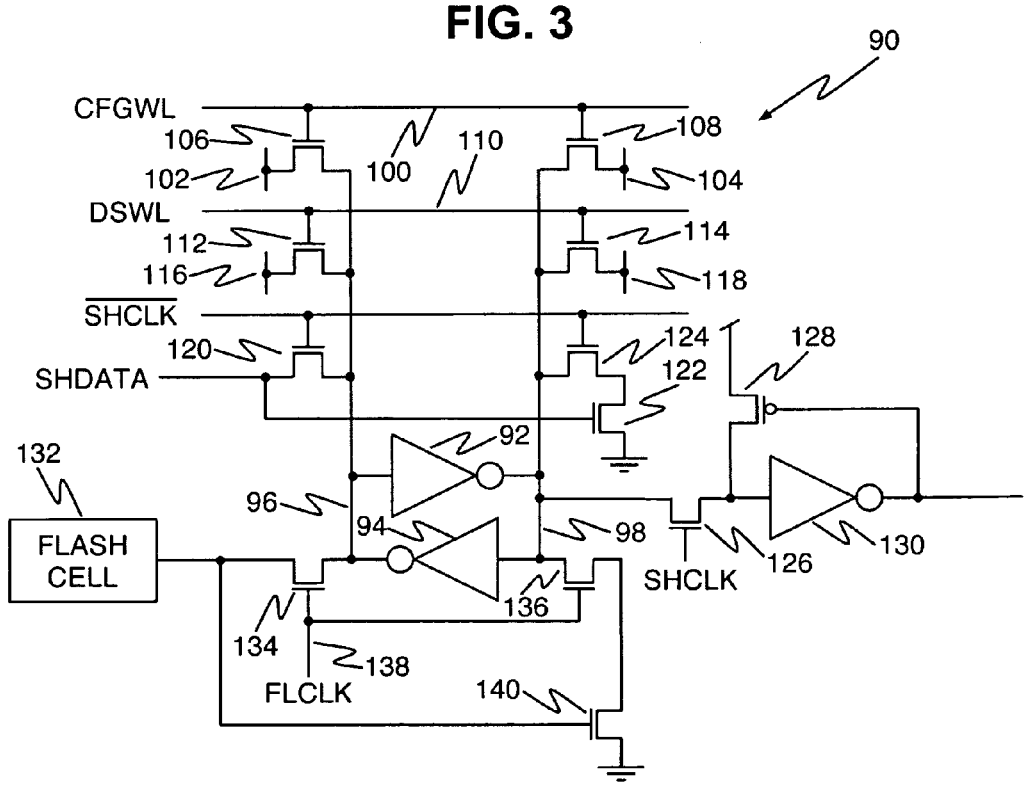
FIG. 4 is a schematic diagram of a circuit like that of FIG. 1 incorporating the features of the present invention.

Referring now to FIG. 4, a schematic diagram shows how a prior-art circuit like that of FIG. 1 can be modified to incorporate the features of the present invention. SRAM cell 90 employs a pair of head-to-tail connected inverters 92 and 94 connected between complementary data bit nodes 96 and 98.

SRAM cell 90 can be employed as a programming element for the programmable device by activating configuration word line (CFGWL) 100 to drive configuration bit lines 102 and 104 by turning on transistors 106 and 108. As in the circuit of FIG. 1, one or both of these configuration bit lines 102 and 104 are used to read or write the SRAM cell 90. Similarly, SRAM cell 90 can be written to or read from by activating distributed SRAM word line 110, thus turning on transistors 112 and 114 to either drive complementary data from the data bit nodes 96 and 98 to SRAM bit lines 116 and 118 or drive data from SRAM bit lines 116 and 118 onto data bit nodes 96 and 98 to force the states of inverters 92 and 94.

SRAM cell 90 may also have its state set by clocking in data using MOS transistors 120, 122, 124, 126, and 128 and inverter 130 as a serial shift register as shown. Data (SHDATA) is clocked onto data node 96 through transistor 120. The complement of the data is generated by transistor 122 and clocked onto data node 98 through transistor 124 using inverted one of the two complementary shift clocks (SHCLK!) coupled to the gates of transistors 120 and 124 to function as a master/slave flip-flop. Transistors 126 and 128 and inverter 130 pass the data to the next SRAM cell in the shift register chain.

In addition to this functionality of SRAM cell 90, which is the same as its prior-art counterpart in FIG. 1, SRAM cell 90 may be directly loaded from non-volatile memory cell 132 by turning on transistors 134 and 136 by applying the FLCLK signal on line 138 to the gates of transistors 134 and 136. Transistor 140 inverts the logic level of the bit in the non-volatile memory cell to place on bit node 98. Persons of ordinary skill in the art will understand that either the non-volatile memory cell output needs to be buffered to overcome the outputs of inverter 94 or a non-volatile memory cell of sufficient strength must be used.

As shown in FIGS. 3 and 4, a non-volatile memory cell is connected to the SRAM cell via a NMOS transistor. Depending on the style of non-volatile memory cell used (e.g., how high a voltage is applied to a flash transistor to program or erase it), this may need to be a middle or high voltage transistor to protect the low-voltage transistors in the SRAM cell. A second function performed by this n-channel transistor is to logically isolate the non-volatile memory cell from the SRAM cell to allow the contents of the SRAM cell to be used as distributed SRAM or as a shift register. This would not be possible if the non-volatile memory cell was continuously forcing the SRAM cell to the state of the bit in the non-volatile memory cell. In such a case, the SRAM cell would be unnecessary.

Figure 2:
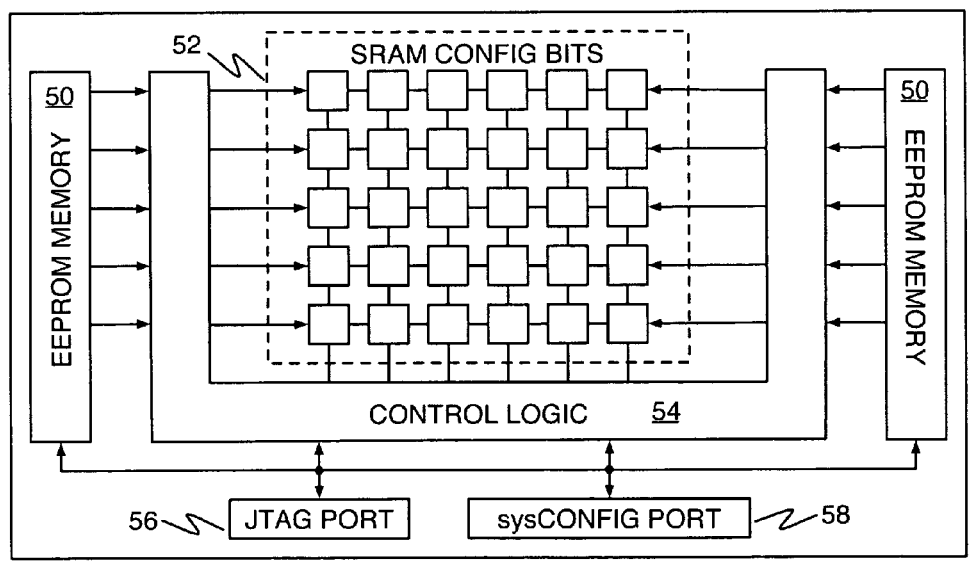
FIG. 2 is a block diagram showing an example of prior-art use of on-chip blocks of flash memory to load and control SRAM programmable elements.

In addition to the non-volatile memory cell circuit protection/isolation transistor, and feedback control transistor shown in FIG. 2, control circuitry may need to be added to the SRAM circuit of FIG. 1 in order to have it controlled by the non-volatile memory cell. This detailed circuit design of this control circuitry is beyond the scope of this disclosure; it could require some local logic or it could be done globally or some combination thereof. The important point is that the isolation transistor, the feedback control transistor, and the various other word lines and bit lines and controls in FIG. 1 and FIG. 1A must be controlled at all times—including when the non-volatile memory cell is loading the SRAM cell so that this operation works correctly. persons of ordinary skill in the art will appreciate that each non-volatile memory cell will need its own continuous sensing transistor since it is not disposed in an array having sense amplifiers.

The embodiments of an SRAM circuit controlled by a non-volatile memory cell shown in FIGS. 2 and 2A are useful for configuring look-up tables (LUTs), or other applications where it is important to maintain SRAM features while employing non-volatile memory. For example, elsewhere on an FPGA device, where SRAM functionality such as configuring a LUT is not required, the non-volatile memory cell may be used to control a buffer or inverter directly as known in the art.

The SRAM cells controlled by non-volatile memory cells of the present invention can be arranged in arrays or otherwise organized into larger circuits to perform logic functions in a programmable logic device such as a field programmable gate array. In one embodiment, an array is formed from a group of memory cells organized into rows and columns, with each memory cell including a non-volatile memory cell controlling an SRAM cell. In another embodiment, the programmable logic in a programmable logic device is controlled by a combination of memory cells that include non-volatile cells controlling SRAM cells (these may be referred to as "compound" memory cells because they include both volatile (i.e., loses its state when power is turned off, such as SRAM) and non-volatile cells) and memory cells that include non-volatile cells, but do not control corresponding SRAM cells (these may be referred to as "basic" or "stand-alone" non-volatile cells because they do not include a volatile memory cell). For example, in a programmable logic architecture employing LUTs and multiplexers, the memory cells in the LUTs may be comprised of compound memory cells, while the cells performing other functions, such as controlling settings on multiplexers that control routing or other static functions, may be comprised of basic memory cells (i.e., stand-alone non-volatile cells).

In other words, the address space of a non-volatile array in a programmable logic device may or may not be fully populated with SRAM bits.

While embodiments and applications of this invention have been shown and described, it would be apparent to those skilled in the art that many more modifications than mentioned above are possible without departing from the inventive concepts herein. For example, the SRAM cells have been shown as a six transistor (6T) cell, persons skilled in the art will understand that other SRAM cells are contemplated as being within the scope of the invention. The invention, therefore, is not to be restricted except in the spirit of the appended claims.

What is claimed is:

1. A multi-purpose static random-access-memory cell controllable by a non-volatile memory cell comprising:
    a non-volatile memory cell having an output;
    a static random-access-memory cell word line;
    first and second complimentary static random-access-memory cell bit lines;
    a first bit node;
    a first access transistor coupled between the first bit node and the first complementary static random-access-memory cell bit line, the first access transistor having a gate coupled to the static random-access-memory cell word line;
    a second bit node;
    a second access transistor coupled between the second bit node and the second complementary static random-access-memory cell bit line, the second access transistor having a gate coupled to the static random-access-memory cell word line;
    a first inverter having an input coupled to the first bit node and an output coupled to the second bit node;
    a second inverter having an input coupled to the second bit node and an output coupled to the first bit node through a second transistor switch having a gate coupled to the control circuit;
    a first transistor switch coupled between the output of the non-volatile memory cell and the first bit node;
    a control circuit coupled to the gate of the first transistor switch.

2. The multi-purpose static random-access-memory cell of claim 1 wherein the output of the non-volatile memory cell has a drive level selected to overpower the output of the second inverter.

3. The multi-purpose static random-access-memory cell of claim 1 wherein the output of the non-volatile memory cell is buffered to overpower the output of the second inverter.

4. The multi-purpose static random-access-memory cell of claim 1, further including a buffer having an input coupled to the second bit node and an output coupleable to a circuit node to be controlled by the SRAM cell.

5. The multi-purpose static random-access-memory cell of claim 1, wherein the static random-access-memory cell comprises a programmable element for a programmable logic device.

6. The multi-purpose static random-access-memory cell of claim 5, wherein the programmable logic device is a field programmable gate array.

7. A multi-purpose static random-access-memory cell controllable by a non-volatile memory cell comprising:
    a static random-access-memory cell coupled between first and second complimentary static random-access-memory cell bit nodes;
    a static random-access-memory cell word line;
    first and second complimentary static random-access-memory cell bit lines respectively coupled to the first and second complimentary static random-access-memory cell bit nodes through first and second access transistors, each of the first and second access transistors having a gate coupled to the static random-access-memory cell word line;
    a configuration word line;
    first and second complimentary configuration bit lines respectively coupled to the first and second complimentary static random-access-memory cell bit nodes through third and fourth access transistors, each of the third and fourth access transistors having a gate coupled to the configuration word line;
    a serial shift register stage having first and second complementary clock lines and coupled to the first and second complimentary static random-access-memory cell bit nodes;
    a non-volatile memory cell having an output;
    a complementing transistor coupled to the output of the non-volatile memory;
    a first transistor switch coupled between the output of the non-volatile memory cell and the first static random-access-memory cell bit node, the first transistor switch having a gate;
    a second transistor switch coupled between the output of the complementing transistor and the first static random-access-memory cell bit node, the second transistor switch having a gate;
    a control circuit coupled to the gates of the first and second transistor switches.

8. The multi-purpose static random-access-memory cell of claim 7 wherein the output of the non-volatile memory cell and the complementing transistor each have a drive level selected to force the state of the static random-access-memory cell.

* * * * *

UNITED STATES PATENT AND TRADEMARK OFFICE
CERTIFICATE OF CORRECTION

| | | |
|---|---|---|
| PATENT NO. | : 7,099,189 B1 | Page 1 of 1 |
| APPLICATION NO. | : 10/959404 | |
| DATED | : August 29, 2006 | |
| INVENTOR(S) | : William C. Plants | |

It is certified that error appears in the above-identified patent and that said Letters Patent is hereby corrected as shown below:

In the Claims

Column 7, Line 38, Claim 1, delete "the" and insert -- a --

Column 7, Line 41, Claim 1, delete "a" and insert -- the --

Column 8, Line 42, Claim 7, delete "first" and insert -- second --

Signed and Sealed this

First Day of April, 2014

Michelle K. Lee
*Deputy Director of the United States Patent and Trademark Office*